(12) United States Patent
Lee et al.

(10) Patent No.: US 11,276,692 B2
(45) Date of Patent: Mar. 15, 2022

(54) MANUFACTURING METHOD OF INTEGRATED CIRCUIT

(71) Applicant: TAIWAN SEMICONDUCTOR MANUFACTURING CO., LTD., Hsinchu (TW)

(72) Inventors: Yi-Jing Lee, Hsinchu (TW); Kun-Mu Li, Hsinchu County (TW); Ming-Hua Yu, Hsinchu (TW); Tsz-Mei Kwok, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 135 days.

(21) Appl. No.: 16/714,465

(22) Filed: Dec. 13, 2019

(65) Prior Publication Data

US 2020/0119006 A1 Apr. 16, 2020

Related U.S. Application Data

(60) Division of application No. 15/895,987, filed on Feb. 13, 2018, now Pat. No. 10,510,753, which is a (Continued)

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823418* (2013.01); *H01L 21/823431* (2013.01); *H01L 21/823468* (2013.01); *H01L 21/823821* (2013.01); *H01L 21/845* (2013.01); *H01L 27/0924* (2013.01); *H01L 27/1211* (2013.01);
(Continued)

(58) Field of Classification Search
None
See application file for complete search history.

(56) References Cited

U.S. PATENT DOCUMENTS

| 8,264,021 B2 | 9/2012 | Lai et al. |
| 2005/0145954 A1 | 7/2005 | Zhu et al. |

(Continued)

FOREIGN PATENT DOCUMENTS

| CN | 1638067 A | 7/2005 |
| CN | 103378135 A | 10/2013 |

(Continued)

*Primary Examiner* — Long Pham
(74) *Attorney, Agent, or Firm* — Maschoff Brennan

(57) ABSTRACT

A method for manufacturing an integrated circuit is provided. The method includes forming first and second semiconductor fins; forming first and second dielectric fin sidewall structures on opposite sidewalls of the first semiconductor fin, wherein the first dielectric fin sidewall structure is higher than the second dielectric fin sidewall structure, and the second dielectric fin sidewall structure is between the first and second semiconductor fins; recessing at least a portion of the first semiconductor fin between the first and second dielectric fin sidewall structures until a top of the recessed portion of the first semiconductor fin is lower than a top of the first dielectric fin sidewall structure; and forming a first epitaxy structure on the recessed portion of the first semiconductor fin.

20 Claims, 14 Drawing Sheets

Related U.S. Application Data continuation of application No. 14/875,504, filed on Oct. 5, 2015, now Pat. No. 9,922,975.

(51) Int. Cl.
*H01L 27/12* (2006.01)
*H01L 21/8238* (2006.01)
*H01L 27/092* (2006.01)
*H01L 21/84* (2006.01)
*H01L 29/78* (2006.01)
*H01L 29/06* (2006.01)

(52) U.S. Cl.
CPC ...... *H01L 29/0649* (2013.01); *H01L 29/7848* (2013.01)

(56) References Cited

U.S. PATENT DOCUMENTS

| | | |
|---|---|---|
| 2012/0043597 A1 | 2/2012 | Chen et al. |
| 2013/0248952 A1 | 9/2013 | Rosenbaum et al. |
| 2013/0270652 A1 | 10/2013 | Liaw |
| 2014/0065782 A1 | 3/2014 | Lu et al. |
| 2014/0097496 A1 | 4/2014 | Hu et al. |
| 2014/0191323 A1 | 7/2014 | Bergendahl et al. |
| 2014/0220751 A1 | 8/2014 | Lee et al. |
| 2014/0220753 A1 | 8/2014 | Lee et al. |
| 2014/0273397 A1 | 9/2014 | Rodder et al. |
| 2015/0035074 A1 | 2/2015 | Obradovic et al. |
| 2015/0076558 A1 | 3/2015 | Lee et al. |
| 2015/0076610 A1 | 3/2015 | Ito |
| 2015/0140756 A1 | 5/2015 | Yu et al. |
| 2015/0243745 A1 | 8/2015 | Kelly et al. |
| 2015/0249036 A1 | 9/2015 | Cai et al. |
| 2015/0372139 A1 | 12/2015 | Wei et al. |
| 2016/0049467 A1 | 2/2016 | Wu et al. |
| 2016/0315146 A1* | 10/2016 | Jung .............. H01L 27/0886 |
| 2016/0315172 A1* | 10/2016 | Wu .................. H01L 29/785 |
| 2017/0148877 A1 | 5/2017 | Jung et al. |

FOREIGN PATENT DOCUMENTS

| | | |
|---|---|---|
| JP | 2005-1977334 A | 7/2005 |
| KR | 10-1376451 B1 | 3/2014 |
| KR | 10-14-0112374 A | 9/2014 |
| KR | 10-2016-0126292 A | 11/2016 |
| TW | I456760 B | 10/2014 |
| TW | I463655 B | 12/2014 |
| TW | 201513359 A | 4/2015 |

* cited by examiner

MANUFACTURING METHOD OF INTEGRATED CIRCUIT

PRIORITY CLAIM AND CROSS-REFERENCE

The present application is a divisional application of the application Ser. No. 15/895,987, filed on Feb. 13, 2018, now U.S. Pat. No. 10,510,753, issued Dec. 17, 2019, which is a continuation application of the application Ser. No. 14/875,504, filed on Oct. 5, 2015, now U.S. Pat. No. 9,922,975, issued Mar. 20, 2018, all of which are herein incorporated by reference in their entireties.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A FinFET includes an extended semiconductor fin that is elevated above a substrate in a direction normal to the plane of the substrate. The channel of the FET is formed in this vertical fin. A gate is provided over (e.g., wrapping) the fin. The FinFETs further can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 6A are top views of a method for manufacturing an integrated circuit at various stages in accordance with some embodiments of the present disclosure.

FIGS. 2B to 6B are perspective views of area B of FIGS. 2A to 6A.

DETAILED DESCRIPTION

Figure 1:
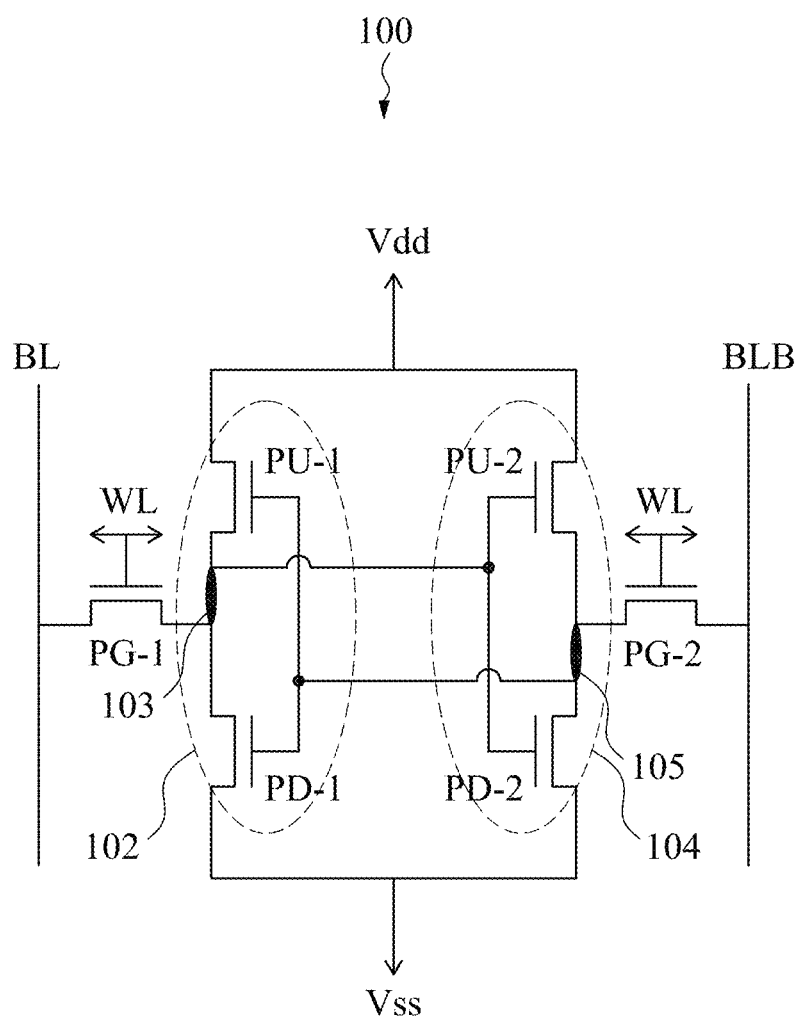
FIG. 1 is a circuit diagram of a six transistor (6T) SRAM cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments, a static random-access memory (SRAM) formed of fin field effect transistors (FinFETs). The embodiments of the disclosure may also be applied, however, to a variety of integrated circuits. Various embodiments will be explained in detail with reference to the accompanying drawings.

Static random-access memory (SRAM) is a type of volatile semiconductor memory that uses bistable latching circuitry to store each bit. Each bit in an SRAM is stored on four transistors (PU-1, PU-2, PD-1, and PD-2) that form two cross-coupled inverters. This SRAM cell has two stable states which are used to denote 0 and 1. Two additional access transistors (PG-1 and PG-2) serve to control the access to a storage cell during read and write operations.

FIG. 1 is a circuit diagram of a six transistor (6T) SRAM cell. The SRAM cell 100 includes a first inverter 102 formed by a pull-up transistor PU-1 and a pull-down transistor PD-1. The SRAM cell 100 further includes a second inverter 104 formed by a pull-up transistor PU-2 and a pull-down transistor PD-2. Furthermore, both the first inverter 102 and second inverter 104 are coupled between a voltage bus Vdd and a ground potential Vss. In some embodiments, the pull-up transistor PU-1 and PU-2 can be p-type metal oxide semiconductor (PMOS) transistors while the pull-down transistors PD-1 and PD-2 can be n-type metal oxide semiconductor (NMOS) transistors, and the claimed scope of the present disclosure is not limited in this respect.

In FIG. 1, the first inverter 102 and the second inverter 104 are cross-coupled. That is, the first inverter 102 has an input connected to the output of the second inverter 104. Likewise, the second inverter 104 has an input connected to the output of the first inverter 102. The output of the first inverter 102 is referred to as a storage node 103. Likewise, the output of the second inverter 104 is referred to as a storage node 105. In a normal operating mode, the storage node 103 is in the opposite logic state as the storage node 105. By employing the two cross-coupled inverters, the SRAM cell 100 can hold the data using a latched structure so that the stored data will not be lost without applying a refresh cycle as long as power is supplied through the voltage bus Vdd.

In an SRAM device using the 6T SRAM cells, the cells are arranged in rows and columns. The columns of the SRAM array are formed by a bit line pairs, namely a first bit line BL and a second bit line BLB. The cells of the SRAM device are disposed between the respective bit line pairs. As shown in FIG. 1, the SRAM cell 100 is placed between the bit line BL and the bit line BLB.

In FIG. 1, the SRAM cell 100 further includes a first pass-gate transistor PG-1 connected between the bit line BL and the output of the first inverter 102. The SRAM cell 100 further includes a second pass-gate transistor PG-2 connected between the bit line BLB and the output of the second inverter 104. The gates of the first pass-gate transistor PG-1 and the second pass-gate transistor PG-2 are connected to a word line WL, which connects SRAM cells in a row of the SRAM array.

In operation, if the pass-gate transistors PG-1 and PG-2 are inactive, the SRAM cell 100 will maintain the complementary values at storage nodes 103 and 105 indefinitely as long as power is provided through the voltage bus Vdd. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

In the circuit diagram of FIG. 1, the pull-up transistors PU-1, PU-2 are p-type transistors. The pull-down transistors PD-1, PD-2, and the pass-gate transistors PG-1, PG-2 are n-type transistors. According to various embodiments, the pull-up transistors PU-1, PU-2, the pull-down transistors PD-1, PD-2, and the pass-gate transistors PG-1, PG-2 can be implemented by FinFETs.

The structure of the SRAM cell 100 in FIG. 1 is described in the context of the 6T-SRAM. One of ordinary skill in the art, however, should understand that features of the various embodiments described herein may be used for forming other types of devices, such as an 8T-SRAM device, or memory devices other than SRAMs. Furthermore, embodiments of the present disclosure may be used as stand-alone memory devices, memory devices integrated with other integrated circuitry, or the like. Accordingly, the embodiments discussed herein are illustrative of ways to make and use the disclosure, and do not limit the scope of the disclosure.

Figure 2A:
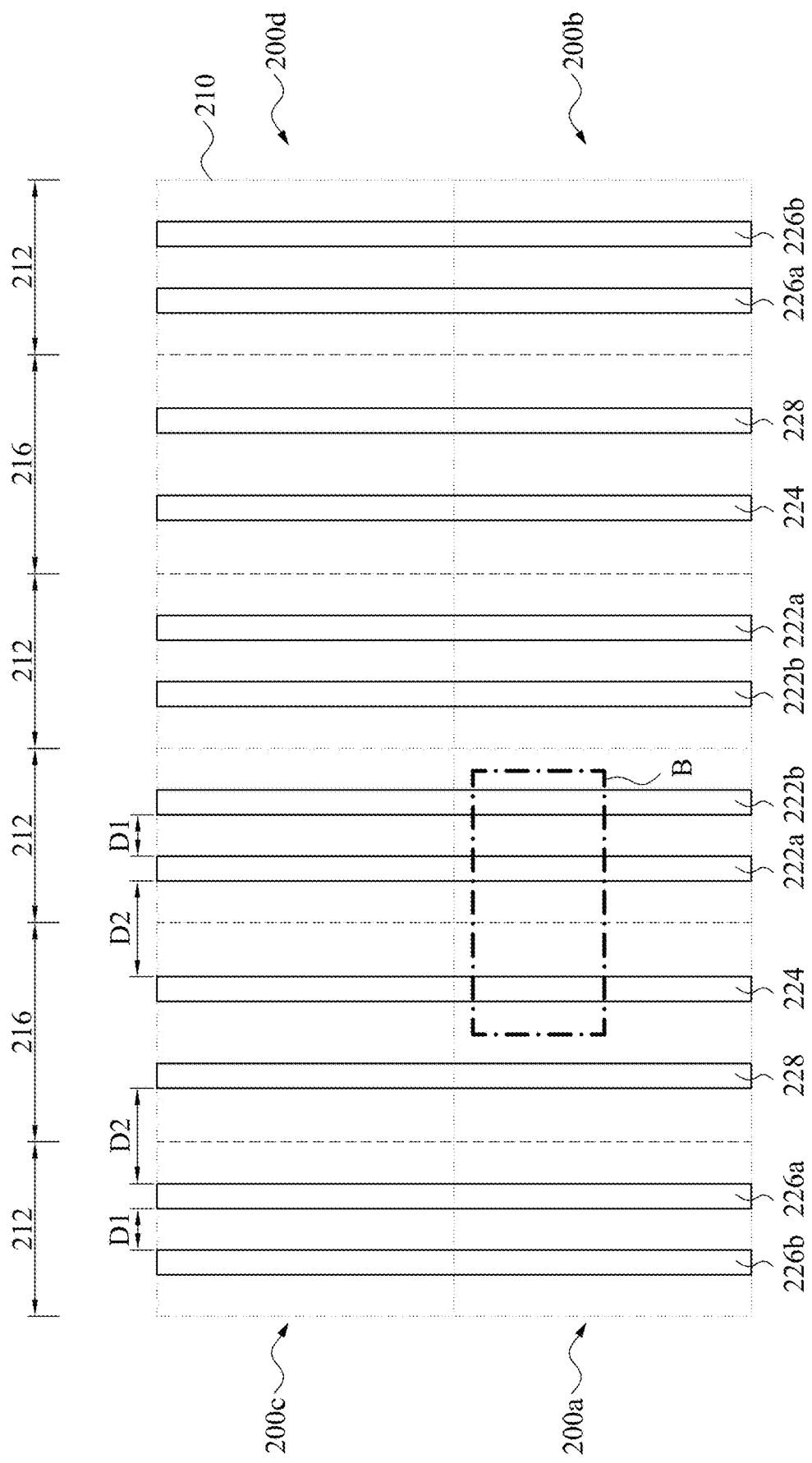
Figure 2B:
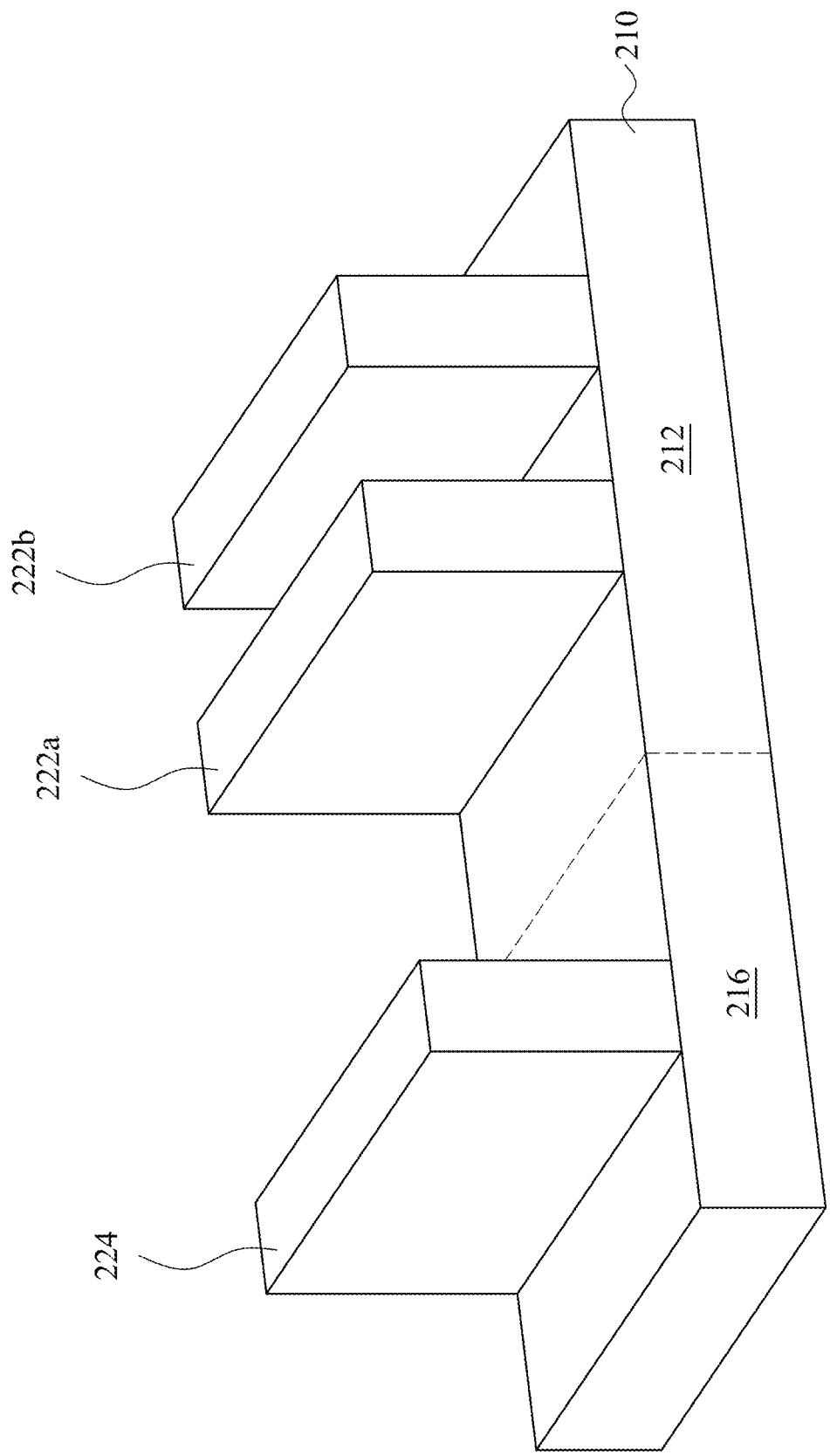

FIGS. 2A to 6A are top views of a method for manufacturing an integrated circuit at various stages in accordance with some embodiments of the present disclosure, and FIGS. 2B to 6B are perspective views of area B of FIGS. 2A to 6A. In FIGS. 2A to 6A, the integrated circuit is an SRAM device including four memory cells 200a, 200b, 200c, and 200d. In some other embodiments, however, the number of the memory cells 200a, 200b, 200c, and 200d in the SRAM device is not limited in this respect. Reference is made to FIGS. 2A and 2B. A substrate 210 is provided. In some embodiments, the substrate 210 may be a semiconductor material and may include known structures including a graded layer or a buried oxide, for example. In some embodiments, the substrate 210 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 210. Alternatively, the silicon substrate 210 may be an active layer of a semiconductor-on-insulator (SOI) substrate or a multi-layered structure such as a silicon-germanium layer formed on a bulk silicon layer.

A plurality of first well regions 212 and a plurality of second well regions 216 are formed in the substrate 210. One of the second well regions 216 is formed between two of the first well regions 212. In some embodiments, the first well region 212 is a p-well region, and the second well region 216 is an n-well region, and the claimed scope is not limited in this respect. In some embodiments, the first well regions 212 are implanted with P dopant material, such as boron ions, and the second well regions 216 are implanted with N dopant material such as arsenic ions. During the implantation of the first well regions 212, the second well regions 216 are covered with masks (such as photoresist), and during implantation of the second well regions 216, the first well regions 212 are covered with masks (such as photoresist).

A plurality of semiconductor fins 222a, 222b, 224, 226a, 226b, and 228 are formed on the substrate 210. In greater detail, the semiconductor fins 222a, 222b, 226a and 226b are formed on the first well regions 212, and the semiconductor fins 224 and 228 are formed on the second well regions 216. In some embodiments, the semiconductor fins 222a, 222b, 224, 226a, 226b, and 228 include silicon. It is note that the number of the semiconductor fins 222a, 222b, 224, 226a, 226b, and 228 in FIG. 2A is illustrative, and should not limit the claimed scope of the present disclosure. A person having ordinary skill in the art may select suitable number for the semiconductor fins 222a, 222b, 224, 226a, 226b, and 228 according to actual situations. For example, in FIG. 2A, the number of the semiconductor fins (i.e., 222a and 222b) are two, so as the semiconductor fins (i.e., 226a and 226b). However, in some other embodiments, the numbers of the semiconductor fins in the first well regions 212 can be respectively greater than two.

In FIG. 2A, a first distance D1 between the semiconductor fins 222a and 222b (or 226a and 226b) is shorter than a second distance D2 between the semiconductor fins 222a and 224 (or 226a and 228). That is, the semiconductor fins 222a, 222b, 226a, 226b on the first well regions 212 are denser than the semiconductor fins 224 and 228 on the second well region 216.

The semiconductor fins 222a, 222b, 224, 226a, 226b, and 228 may be formed, for example, by patterning and etching the substrate 210 using photolithography techniques. In some embodiments, a layer of photoresist material (not shown) is deposited over the substrate 210. The layer of photoresist material is irradiated (exposed) in accordance with a desired pattern (the semiconductor fins 222a, 222b, 224, 226a, 226b, and 228 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

Figure 3A:
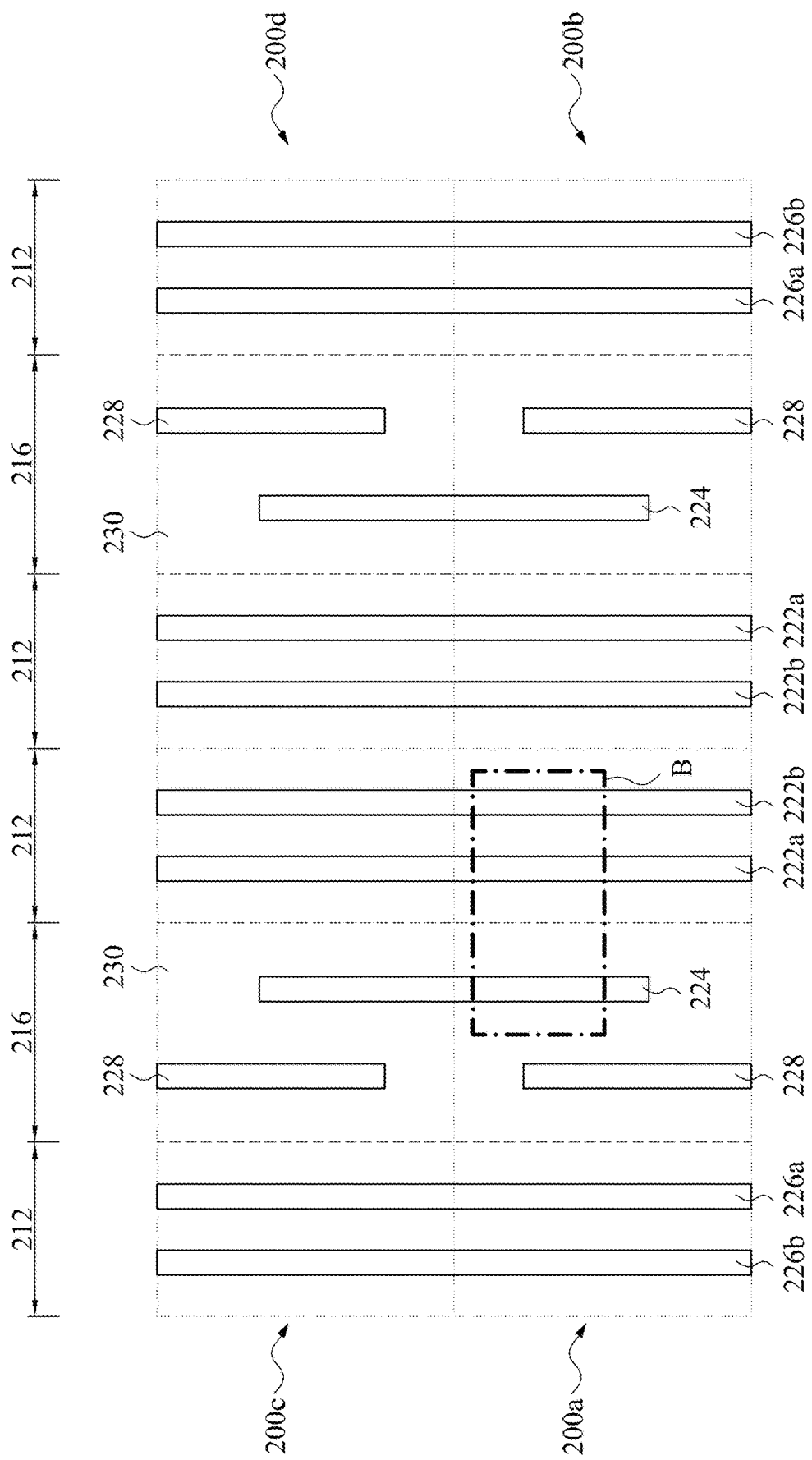
Figure 3B:
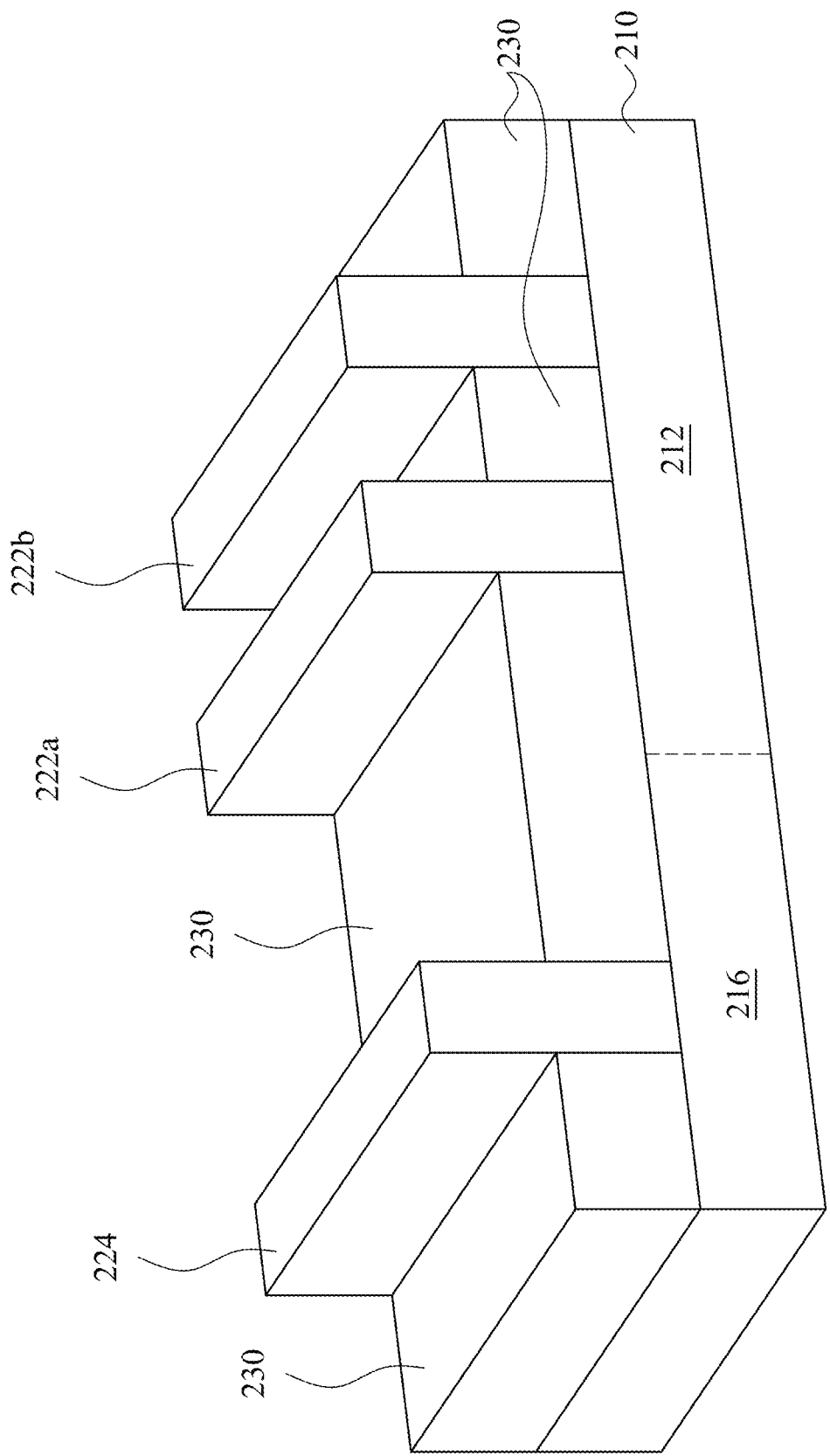

Reference is made to FIGS. 3A and 3B. A portion of the semiconductor fins 224 and 228 are removed. For example, a photomask (not shown) containing patterns for both the semiconductor fins 224 and 228 are used to protect portions of the semiconductor fins 224 and 228 to be kept. Exposed portions of both the semiconductor fins 224 and 228 are then etched at the same time.

Subsequently, a plurality of isolation structures 230 are formed on the substrate 210. The isolation structures 230, which act as a shallow trench isolation (STI) around the semiconductor fins 222a, 222b, 224, 226a, 226b, and 228, may be formed by chemical vapor deposition (CVD) techniques using tetra-ethyl-ortho-silicate (TEOS) and oxygen as a precursor. In some other embodiments, the isolation structures 230 may be formed by implanting ions, such as oxygen, nitrogen, carbon, or the like, into the substrate 210. In yet some other embodiments, the isolation structures 230 are insulator layers of a SOI wafer.

Figure 4A:
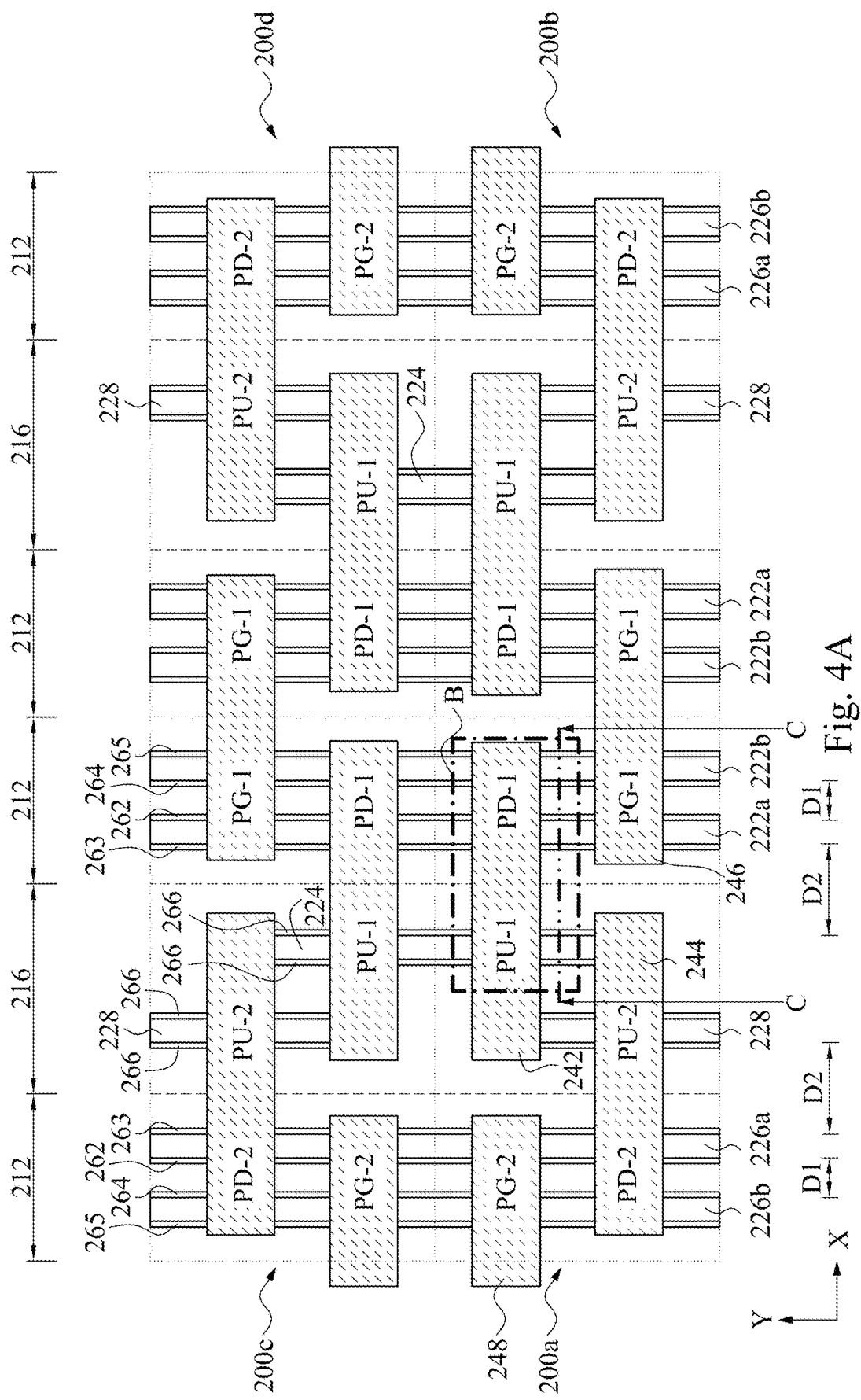
Figure 4B:
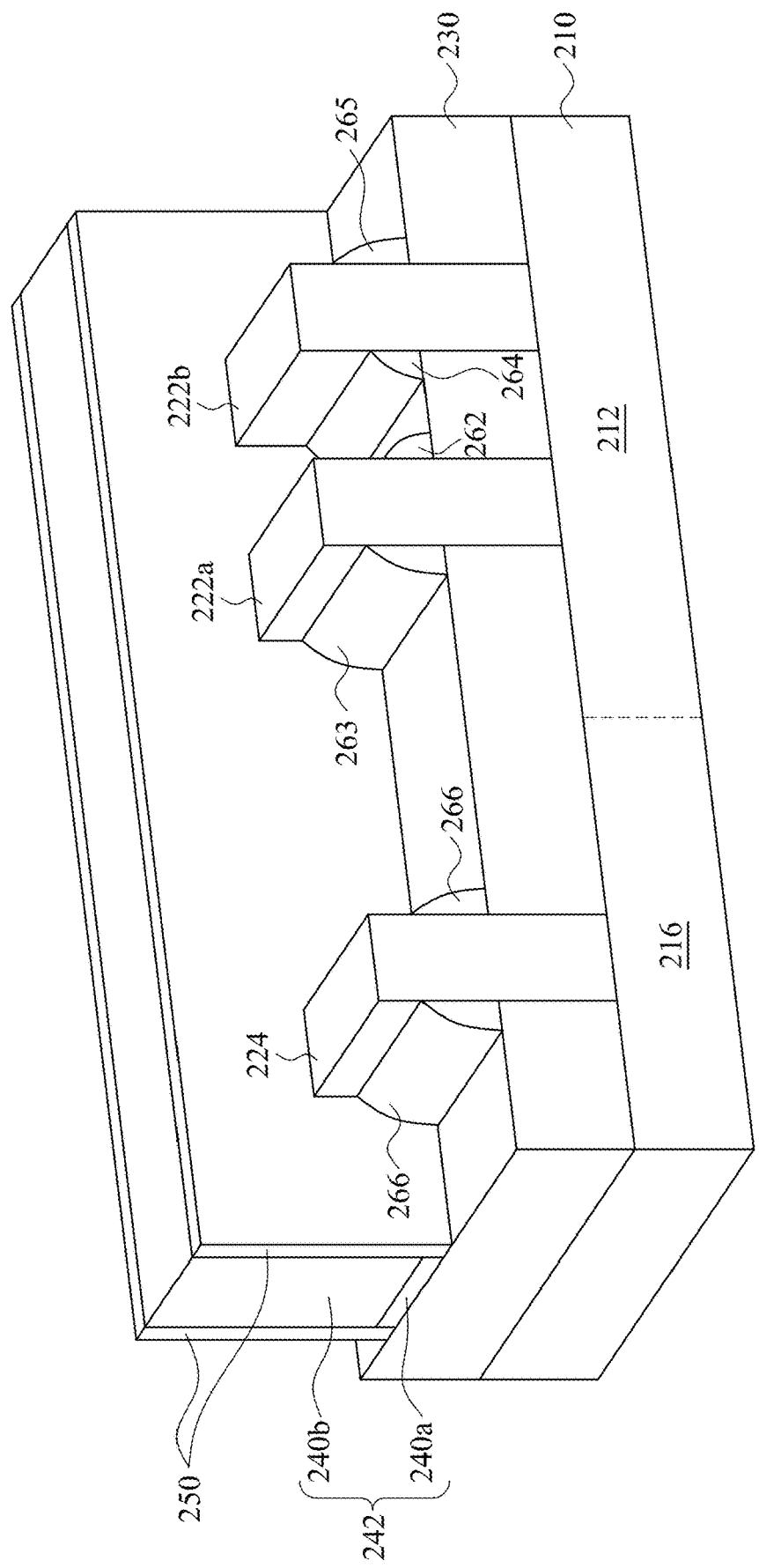

Reference is made to FIGS. 4A and 4B. A plurality of gate stacks 242, 244, 246, and 248 are formed on portions of the semiconductor fins 222a, 222b, 224, 226a, 226b, and 228 and expose another portions of the semiconductor fins 222a, 222b, 224, 226a, 226b, and 228. In greater detail, the gate stack 242 is formed on portions of the semiconductor fins 222a, 222b and 224, and further on a portion of the semiconductor fin 228 in some embodiments; the gate stack 244 is formed on portions of the semiconductor fins 226a, 226b, and 228, and further on a portion of the semiconductor fin 224 in some embodiments; the gate stack 246 is formed on portions of the semiconductor fins 222a and 222b, and the gate stack 248 is formed on portions of the semiconductor fins 226a and 226b.

As shown in FIG. 4B, at least one of the gate stacks 242, 244, 246, and 248 includes a gate insulator layer 240a and a gate electrode layer 240b. The gate insulator layer 240a is disposed between the gate electrode layer 240b and the substrate 210, and is formed on the semiconductor fins 222a, 222b, 224, 226a, 226b, and 228. The gate insulator layer 240a, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate insulator layer 240a may have a multilayer structure such as one layer of silicon oxide (e.g., interfacial layer) and another layer of high-k material.

The gate insulator layer 240b may be formed using chemical vapor deposition (CVD), physical vapor deposition (PVD), atomic layer deposition (ALD), thermal oxide, ozone oxidation, other suitable processes, or combinations thereof. The gate electrode layers 240b are formed over the substrate 210 to cover the gate insulator layers 240a and the portions of the semiconductor fins 222a, 222b, 224, 226a, 226b, and 228. In some embodiments, the gate electrode layer 240b includes a semiconductor material such as polysilicon, amorphous silicon, or the like. The gate electrode layer 240b may be deposited doped or undoped. For example, in some embodiments, the gate electrode layer 240b includes polysilicon deposited undoped by low-pressure chemical vapor deposition (LPCVD). The polysilicon may also be deposited, for example, by furnace deposition of an in-situ doped polysilicon. Alternatively, the gate electrode layer 240b may include a polysilicon metal alloy or a metal gate including metals such as tungsten (W), nickel (Ni), aluminum (Al), tantalum (Ta), titanium (Ti), or any combination thereof.

In FIG. 4B, a plurality of gate spacers 250 are formed over the substrate 210 and along the sides of the gate stacks 242, 244, 246, and 248. For clarity, the gate spacers 250 are illustrated in FIG. 4B and are omitted in FIG. 4A. In some embodiments, the gate spacers 250 may include silicon oxide, silicon nitride, silicon oxy-nitride, or other suitable material. The gate spacers 250 may include a single layer or multilayer structure. A blanket layer of the gate spacers 250 may be formed by CVD, PVD, ALD, or other suitable technique. Then, an anisotropic etching is performed on the blanket layer to form a pair of the gate spacers 250 on two sides of the gate stacks 222a, 222b, 224, 226a, 226b, and 228. In some embodiments, the gate spacers 250 are used to offset subsequently formed doped regions, such as source/drain regions. The gate spacers 250 may further be used for designing or modifying the source/drain region (junction) profile.

A plurality of dielectric fin sidewall structures 262 and 263 are formed on opposite sidewalls of the semiconductor fins 222a and 226a, and a plurality of dielectric fin sidewall structures 264 and 265 are formed on opposite sidewalls of the semiconductor fins 222b and 226b. Moreover, a plurality of dielectric fin sidewall structures 266 are formed on opposite sidewalls of the semiconductor fins 224 and 228. The dielectric fin sidewall structures 262 and 263 are formed along the semiconductor fins 222a and 226a, the dielectric fin sidewall structures 264 and 265 are formed along the semiconductor fins 222b and 226b, and the dielectric fin sidewall structures 266 are formed along the semiconductor fins 224 and 228. In greater detail, in the single SRAM cell 200a (or 200b or 200c or 200d), the dielectric fin sidewall structures 262 and 264 are formed between the semiconductor fins 222a and 222b (or 226a and 226b), the semiconductor fin 222a (or 226a) is formed between the dielectric fin sidewall structures 262 and 263, and the semiconductor fin 222b (or 226b) is formed between the dielectric fin sidewall structures 264 and 265. Moreover, in FIG. 4B, the dielectric fin sidewall structure 263 is disposed between the semiconductor fins 222a and 224 (or 226a and 228). Therefore, the dielectric fin sidewall structures 262 and 264 can be referred as inner dielectric fin sidewall structures, and the dielectric fin sidewall structures 263 and 265 can be referred as outer dielectric fin sidewall structures.

For forming the dielectric fin sidewall structures 262, 263, 264, 265, and 266, in some embodiments, a deposition gas is provided on the semiconductor fins 222a, 222b, 224, 226a, 226b, and 228 to form a dielectric layer (not shown) thereon. In some embodiments, the deposition is done in-situ in an etch chamber using a plasma enhanced chemical vapor deposition (CVD) process, which deposits the dielectric layer to cover the semiconductor fins 222a, 222b, 224, 226a, 226b, and 228. The deposition process may apply some ion bombardment energy to allow for selectivity of such deposition. Since the deposition gas is flowable, and the first distance D1 between the semiconductor fins 222a and 222b (or 226a and 226b) is shorter than the second distance D2 between the semiconductor fins 222a and 224 (or 226a and 228), the amount of dielectric material deposited between the semiconductor fins 222a and 224 (or 226a and 228) is greater than the amount of the dielectric material deposited between the semiconductor fins 222a and 222b (or 226a and 226b). In other words, more dielectric material is deposited on one of the sidewalls of the semiconductor fin 222a (222b, 226a, and/or 226b) than on another of the sidewalls of the first semiconductor fin 222a (222b, 226a, and/or 226b). Hence, the formed dielectric layer is thicker between the semiconductor fins 222a and 224 (or 226a and 228) than between the semiconductor fins 222a and 222b (or 226a and 226b). Subsequently, the dielectric layer is etched back to form the dielectric fin sidewall structures 262, 263, 264, 265, and 266. In some embodiments, the deposition gas may be, but are not limited to, a combination of a first gas precursor and a second gas precursor. The first gas precursor includes a compound containing silicon atoms (e.g., $SiH_4$, $SiH_3$, $SiCl_2H_2$), and the second gas precursor includes a compound containing nitrogen atoms (e.g., $NH_3$, $N_{20}$). For example, $SiCl_2H_2$ gas is reacted with $NH_3$ to form a silicon nitride deposition layer. The silicon nitride deposition layer is then etched by using etching gas such as HBr, $Cl_2$, $CH_4$, $CHF_3$, $CH_2F_2$, $CF_4$, Ar, $H_2$, $N_2$, $O_2$, or combinations thereof.

Figure 4C:
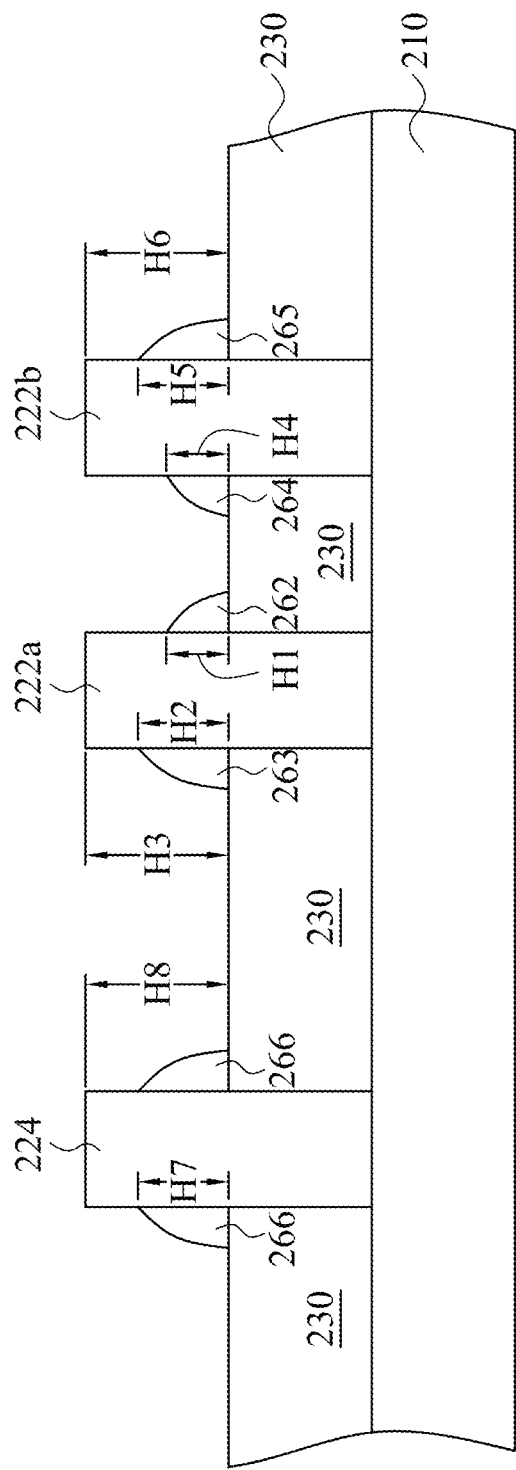
FIG. 4C is a cross-sectional view taken along line C-C of FIG. 4A.

FIG. 4C is a cross-sectional view taken along line C-C of FIG. 4A. In FIG. 4C, the dielectric fin sidewall structure 262 has a height H1, and the dielectric fin sidewall structure 263 has a height H2 greater than the height H1. Furthermore, a portion of the semiconductor fin 222a protruding from the isolation structures 230 has a height H3 greater than the heights H1 and H2. Also, the dielectric fin sidewall structure 264 has a height H4, and the dielectric fin sidewall structure 265 has a height H5 greater than the height H4. Furthermore, a portion of the semiconductor fin 222b protruding from the isolation structures 230 has a height H6 greater than the heights H4 and H5. Moreover, the dielectric fin sidewall structures 266 may have substantially the same or different heights. In some embodiments, one of the dielectric fin sidewall structures 266 has a height H7. A portion of the semiconductor fin 224 protruding from the isolation structures 230 has a height H8 greater than the height H7. In some embodiments, the heights H1, H2, H3, and H4 can be in a range from about 10 nm to about 25 nm, and the claimed scope is not limited in this respect. The heights H1, H2, H3, and H4 can be tuned, for example, by etching, to adjust the profile of the epitaxy structures 272a, 272b, and 276 (see FIGS. 6A and 6B) formed thereon.

In FIG. 4A, the semiconductor fins 222a and 222b and the gate stack 242 form a pull-down transistor PD-1, and the semiconductor fin 224 and the gate stack 242 form a pull-up transistor PU-1. In other words, the pull-down transistor PD-1 and the pull-up transistor PU-1 share the gate stack 242. The semiconductor fins 226a and 226b and the gate stack 244 form another pull-down transistor PD-2, and the semiconductor fins 228 and the gate stack 244 form another pull-up transistor PU-2. In other words, the pull-down transistor PD-2 and the pull-up transistor PU-2 share the gate stack 244. Moreover, the semiconductor fins 222a and 222b and the gate stack 246 form a pass-gate transistor PG-1. In other words, the pull-down transistor PD-1 and the pass-gate transistor PG-1 share the semiconductor fins 222a and 222b. The semiconductor fins 226a and 226b and the gate stack 248 form another pass-gate transistor PG-2. In other words, the pull-down transistor PD-2 and the pass-gate transistor PG-2 share the semiconductor fins 226a and 226b. Therefore, the SRAM cell 200a is a six-transistor (6T) SRAM. One of ordinary skill in the art, however, should understand that features of the various embodiments described herein may be used for forming other types of devices, such as an 8T-SRAM device or other integrated circuits.

In FIG. 4A, when the SRAM cells 200a-200d are arranged together to form an array (an SRAM device herein), the cell layouts may be flipped or rotated to enable higher packing densities. Often by flipping the cell over a cell boundary or axis and placing the flipped cell adjacent the original cell, common nodes and connections can be combined to increase packing density. For example, the SRAM cells 200a-200d are mirror images and in rotated images of each other. Specifically, the SRAM cells 200a and 200b are mirror images across a Y-axis, as is SRAM cells 200c and 200d. The SRAM cells 200a and 200c are mirror images across an X-axis, as is SRAM cells 200b and 200d. Further, the diagonal SRAM cells (the SRAM cells 200a and 200d; the SRAM cells 200b and 200c) are rotated images of each other at 180 degrees.

Figure 5A:
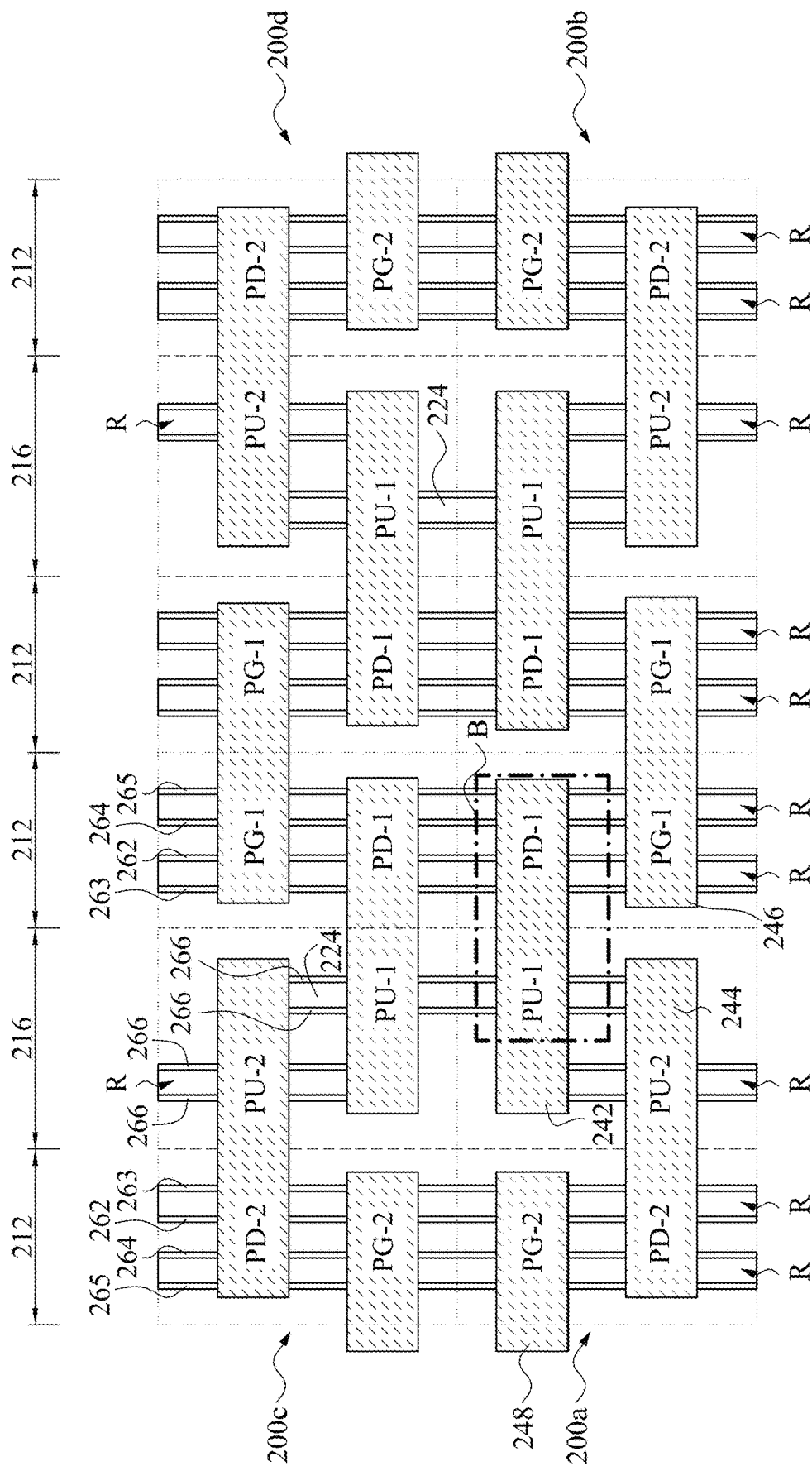
Figure 5B:
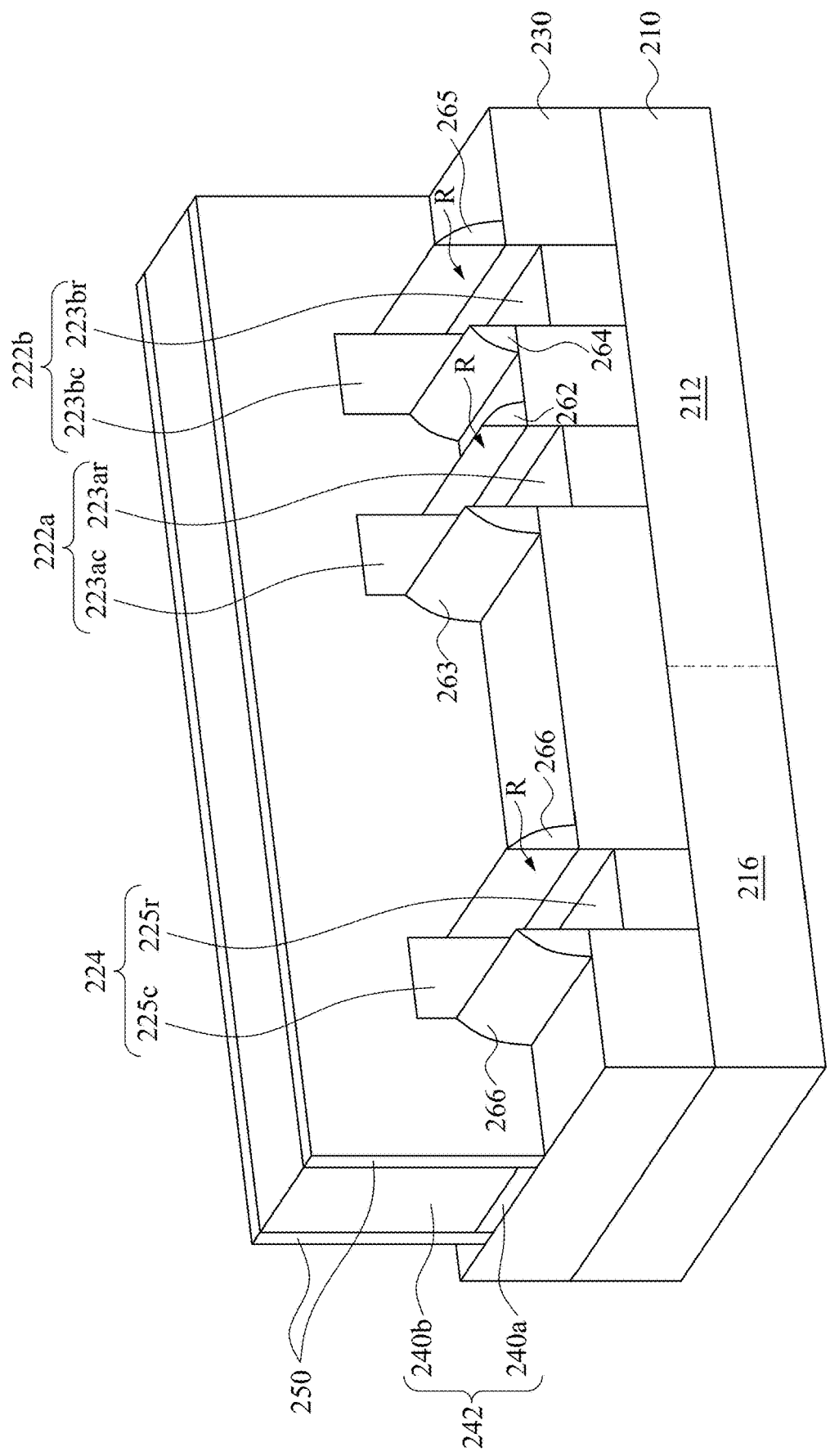

Reference is made to FIGS. 5A and 5B. A portion of the semiconductor fins 222a, 222b, 224, 226a, 226b, and 228 exposed both by the gate stacks 242, 244, 246, and 248 and the gate spacers 250 are partially removed (or partially recessed) to form recesses R in the semiconductor fins 222a, 222b, 224, 226a, 226b, and 228. In FIGS. 5A and 5B, the recess R is formed with the dielectric fin sidewall structures 262 and 263 (or 264 and 265, or 266) as its upper portion. In some embodiments, sidewalls of the recesses R are substantially and vertical parallel to each other. In some other embodiments, the recesses R are formed with a non-vertical parallel profile.

In FIG. 5B, the semiconductor fin 222a includes at least one channel portion 223ac and at least one recessed portion 223ar. The gate stack 242 covers the channel portion 223ac, and the recess R is formed on the recessed portion 223ar. The semiconductor fin 222b includes at least one channel portion 223bc and at least one recessed portion 223br. The gate stack 242 covers the channel portion 223bc, and the recess R is formed on the recessed portion 223br. The semiconductor fin 224 includes at least one channel portion 225c and at least one recessed portion 225r. The gate stack 242 covers the channel portion 225c, and the recess R is formed on the recessed portion 225r. Also, the semiconductor fins 226a, 226b, 228 individually include at least one channel portion and at least one recessed portion (not shown). Since the channel portions and the recessed portions of the semiconductor fins 226a, 226b, 228 have similar configurations to the channel portions 223ac, 223bc, 225c and the recessed portions 223ar, 223br, 225r, and therefore, a description in this regard will not be repeated hereinafter.

The recessing process may include dry etching process, wet etching process, and/or combination thereof. The recessing process may also include a selective wet etch or a selective dry etch. A wet etching solution includes a tetramethylammonium hydroxide (TMAH), a HF/HNO$_3$/CH$_3$COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH$_4$OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include CF$_4$, NF$_3$, SF$_6$, and He. Dry etching may also be performed anisotropically using such mechanisms as DRIE (deep reactive-ion etching).

Figure 6A:
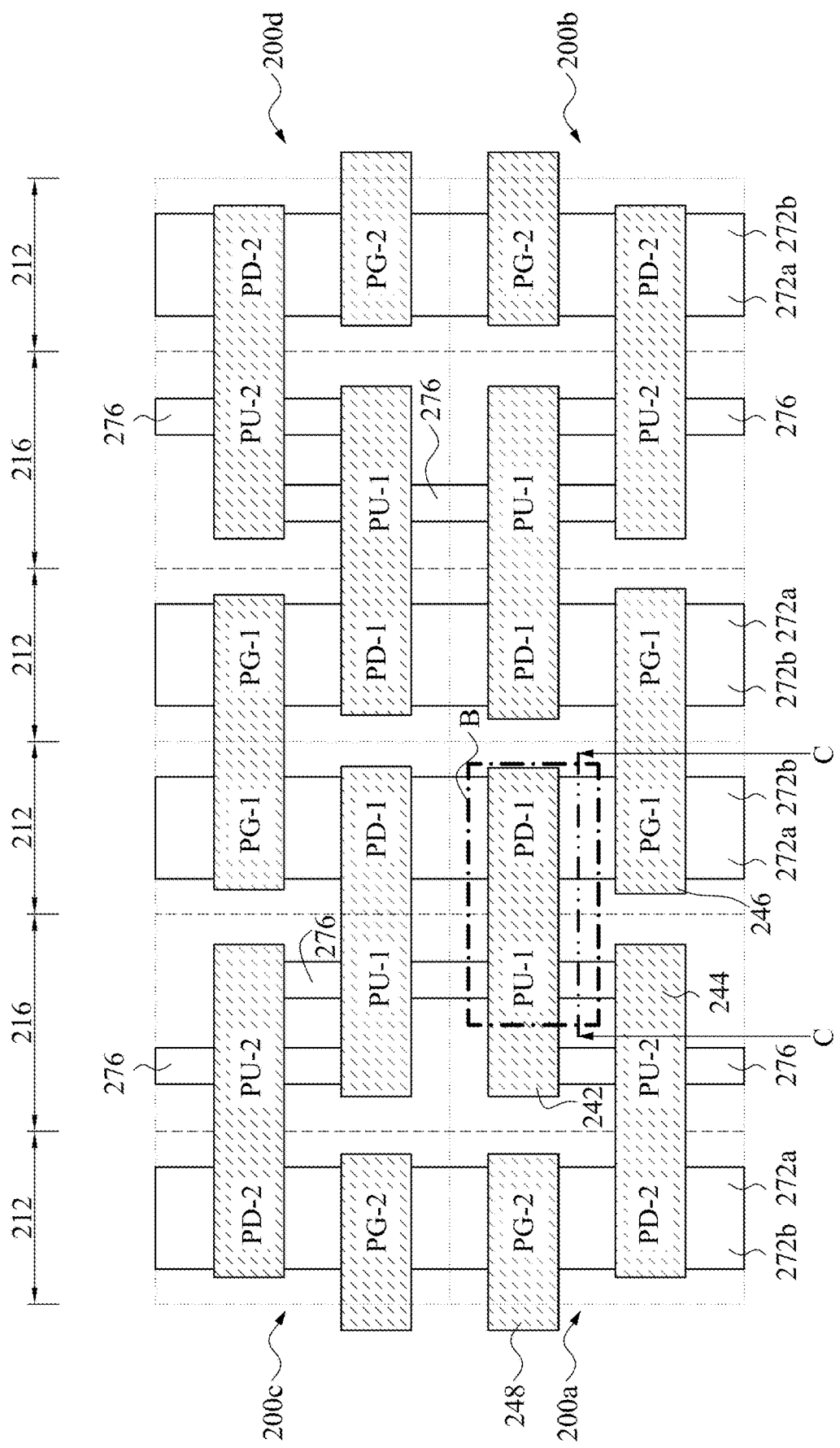
Figure 6B:
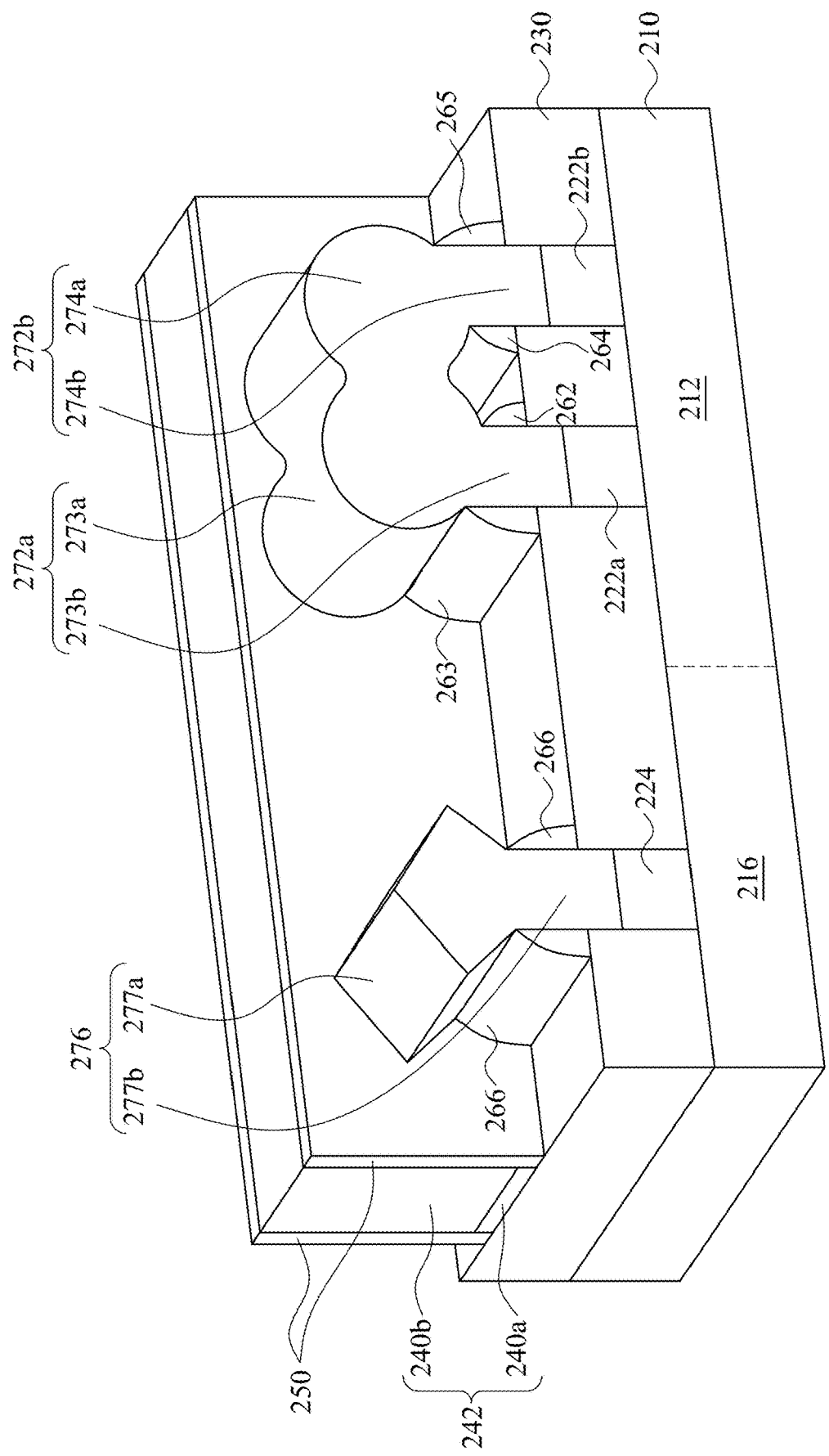

Reference is made to FIGS. 6A and 6B. A plurality of epitaxy structures 272a are respectively formed in the recesses R of the semiconductor fins 222a and 226a (see FIG. 4A), a plurality of epitaxy structures 272b are respectively formed in the recesses R of the semiconductor fins 222b and 226b (see FIG. 4A), and a plurality of epitaxy structures 276 are respectively formed in the recesses R of the semiconductor fins 224 and 228 (see FIG. 4A). The epitaxy structures 272a, 272b, and 276 protrude from the recesses R. The epitaxy structures 272a, 272b, and 276 may be formed using one or more epitaxy or epitaxial (epi) processes, such that Si features, SiGe features, and/or other suitable features can be formed in a crystalline state on the semiconductor fins 222a, 222b, 224, 226a, 226b, and 228. In some embodiments, lattice constants of the epitaxy structures 272a, 272b, and 276 are different from lattice constants of the semiconductor fins 222a, 222b, 224, 226a, 226b, and 228, and the epitaxy structures 272a, 272b, and 276 are strained or stressed to enable carrier mobility of the semiconductor device and enhance the device performance. The epitaxy structures 272a, 272b, and 276 may include semiconductor material such as germanium (Ge) or silicon (Si);

or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxy structures 272a, 272b, and 276 have suitable crystallographic orientation (e.g., a (100), (110), or (111) crystallographic orientation).

In some embodiments, the epitaxy structures 272a and 272b are n-type epitaxy structures, and the epitaxy structures 276 are p-type epitaxy structures. The epitaxy structures 272a, 272b and 276 can be formed in different epitaxy processes. The epitaxy structures 272a and 272b may include SiP, SiC, SiPC, Si, III-V compound semiconductor materials or combinations thereof, and the epitaxy structures 276 may include SiGe, SiGeC, Ge, Si, III-V compound semiconductor materials, or combinations thereof. During the formation of the epitaxy structures 272a and 272b, n-type impurities such as phosphorous or arsenic may be doped with the proceeding of the epitaxy. For example, when the epitaxy structure 272a and 272b include SiC or Si, n-type impurities are doped. Moreover, during the formation of the epitaxy structures 276, p-type impurities such as boron or $BF_2$ may be doped with the proceeding of the epitaxy. For example, when the epitaxy structure 276 includes SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 222a, 222b, 224, 226a, 226b, and 228 (e.g., silicon). Thus, a strained channel can be achieved to increase carrier mobility and enhance device performance. The epitaxy structures 272a, 272b, and 276 may be in-situ doped. If the epitaxy structures 272a, 272b, and 276 are not in-situ doped, a second implantation process (i.e., a junction implant process) is performed to dope the epitaxy structures 272a, 272b, and 276. One or more annealing processes may be performed to activate the epitaxy structures 272a, 272b, and 276. The annealing processes include rapid thermal annealing (RTA) and/or laser annealing processes.

Figure 6C:
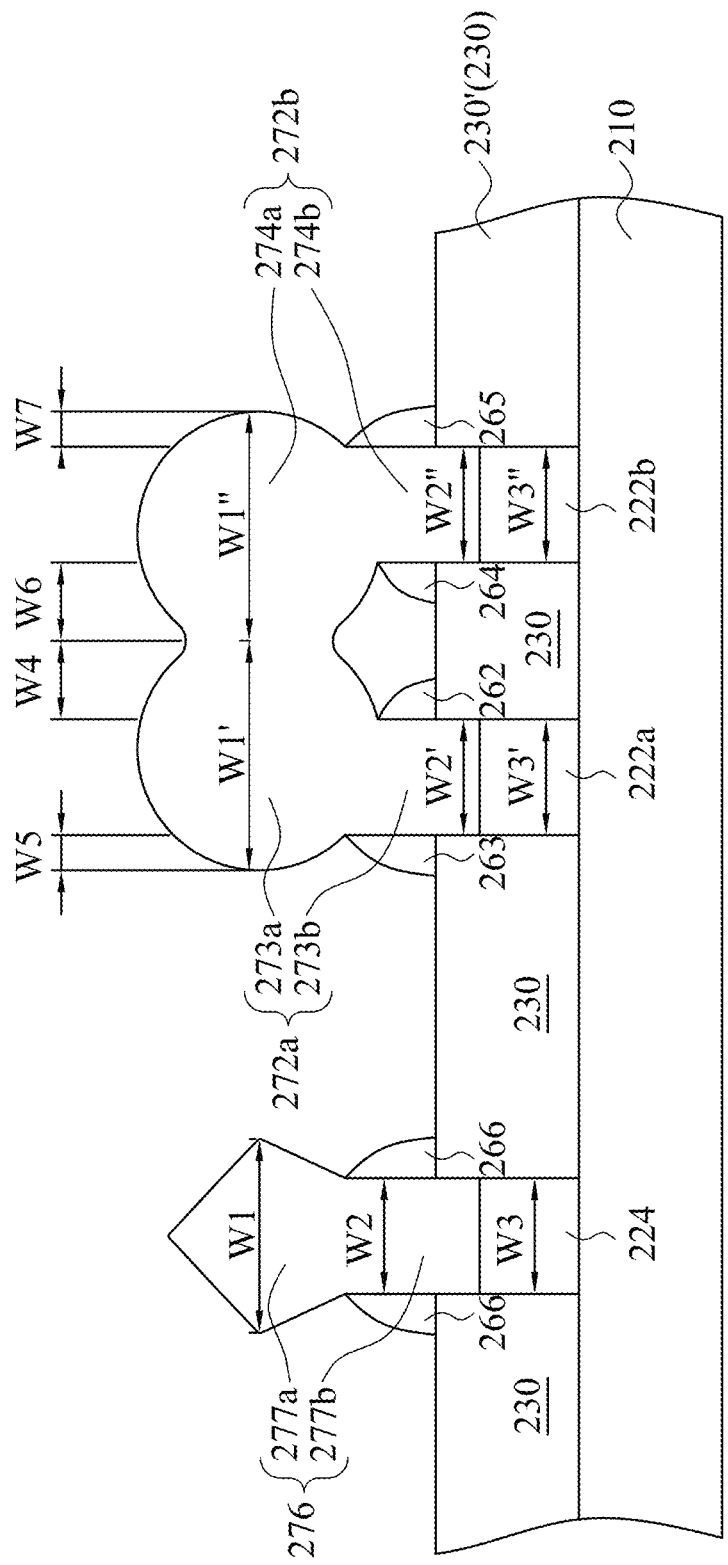
FIG. 6C is a cross-sectional view taken along line C-C of FIG. 6A.

FIG. 6C is a cross-sectional view taken along line C-C of FIG. 6A. The epitaxy structure 276 has a top portion 277a and a body portion 277b disposed between the top portion 277a and the substrate 210. The top portion 277a has a width W1, and the body portion 277b has a width W2 shorter than the width W1. Furthermore, one of the semiconductor fins 224 and 228 has a width W3, and the widths W2 and W3 are substantially the same, and the claimed scope is not limited in this respect. The dielectric fin sidewall structures 266 are disposed on opposite sidewalls of the body portions 277b of the epitaxy structure 276, and the top portions 277a of the epitaxy structure 276 is disposed on the dielectric fin sidewall structures 266. In some embodiments, the top portions 277a of the epitaxy structure 276 has facet surfaces presented above the dielectric fin sidewall structures 266.

Moreover, the epitaxy structure 272a has a top portion 273a and a body portion 273b disposed between the top portion 273a and the substrate 210. The top portion 273a has a width W1', and the body portion 273b has a width W2' shorter than the width W1'. Furthermore, one of the semiconductor fins 222a and 226a has a width W3', and the widths W2' and W3' are substantially the same, and the claimed scope is not limited in this respect. The dielectric fin sidewall structures 262 and 263 are disposed on opposite sidewalls of the body portions 273b of the epitaxy structure 272a, and the top portions 273a of the epitaxy structure 272a is disposed on the dielectric fin sidewall structures 262 and 263. In some embodiments, the top portions 273a of the epitaxy structure 272a has a round surface presented above the dielectric fin sidewall structures 262 and 263.

In addition, the epitaxy structure 272b has a top portion 274a and a body portion 274b disposed between the top portion 274a and the substrate 210. The top portion 274a has a width W1", and the body portion 274b has a width W2" shorter than the width W1". Furthermore, one of the semiconductor fins 222b and 226b has a width W3", and the widths W2" and W3" are substantially the same, and the claimed scope is not limited in this respect. The dielectric fin sidewall structures 264 and 265 are disposed on opposite sidewalls of the body portions 274b of the epitaxy structure 272b, and the top portions 274a of the epitaxy structure 272b is disposed on the dielectric fin sidewall structures 264 and 265. In some embodiments, the top portions 274a of the epitaxy structure 272b has a round surface presented above the dielectric fin sidewall structures 264 and 265.

In FIG. 6C, the epitaxy structures 272a and 272b are physically connected (or merged together), and the epitaxy structure 276 is separated (or isolated) from the epitaxy structures 272a and 272b. In greater detail, the epitaxy structures 272a extends toward the epitaxy structures 272b further than toward the epitaxy structures 276. In other words, a portion of the epitaxy structure 272a located between the semiconductor fins 222a and 222b has a width W4, another portion of the epitaxy structure 272a located between the semiconductor fins 222a and 224 has a width W5, and the width W4 is greater than the width W5. Hence, the epitaxy structure 272a is formed off-center, and the lateral space between the epitaxy structures 272a and 276 is increased. Similarly, the epitaxy structures 272b extends toward the epitaxy structures 272a further than toward the adjacent SRAM cell 200b (see FIG. 6A). In other words, a portion of the epitaxy structure 272b located between the semiconductor fins 222a and 222b has a width W6, another portion of the epitaxy structure 272b located above the isolation structure 230' has a width W7, and the width W6 is greater than the width W7. Hence, the epitaxy structures 272b is formed off-center. Therefore, the epitaxy structures 272a and 272b can be physically connected. In some embodiments, the widths W4 and W6 can be greater than about 10 nm, and the widths W5 and W7 can be in a range from about 5 nm to about 15 nm, and the claimed scope is not limited in this respect.

In FIG. 6A, the semiconductor fins 222a, 222b (see FIG. 4A), the epitaxy structures 272a and 272b formed thereon, the dielectric fin sidewall structures 262, 263, 264, and 265 (see FIG. 4A) formed on opposite sidewalls of the epitaxy structures 272a and 272b, and the gate stack 242 form the pull-down transistor PD-1. The semiconductor fin 224 (see FIG. 4A), the epitaxy structure 276 formed thereon, the dielectric fin sidewall structures 266 (see FIG. 4A) formed on opposite sidewalls of the epitaxy structure 276, and the gate stack 242 form the pull-up transistor PU-1. The semiconductor fins 226a, 226b (see FIG. 4A), the epitaxy structures 272a and 272b formed thereon, the dielectric fin sidewall structures 262, 263, 264, and 265 formed on opposite sidewalls of the epitaxy structures 272a and 272b, and the gate stack 244 form the pull-down transistor PD-2. The semiconductor fin 228 (see FIG. 4A), the epitaxy structure 276 formed thereon, the dielectric fin sidewall structures 266 formed on opposite sidewalls of the epitaxy structure 276, and the gate stack 244 form the pull-up transistor PU-2. The semiconductor fins 222a, 222b, the epitaxy structures 272a and 272b formed thereon, the dielectric fin sidewall structures 262, 263, 264, and 265 formed on opposite sidewalls of the epitaxy structure 272a and 272b, and the gate stack 246 form the pass-gate transistor PG-1. The semiconductor fins 226a and 226b (see FIG. 4A), the epitaxy structures 272a and 272b formed thereon, the dielectric fin sidewall structures 262, 263, 264, and 265 formed on opposite sidewalls of the epitaxy structures 272a and 272b, and the gate stack 248 form the pass-gate transistor PG-2. Therefore, the SRAM cell 200a is a six-transistor (6T) SRAM. One of ordinary skill in the art, however, should understand that features of the various embodiments described herein may be used for forming other types of devices, such as an 8T-SRAM device.

Figure 7:
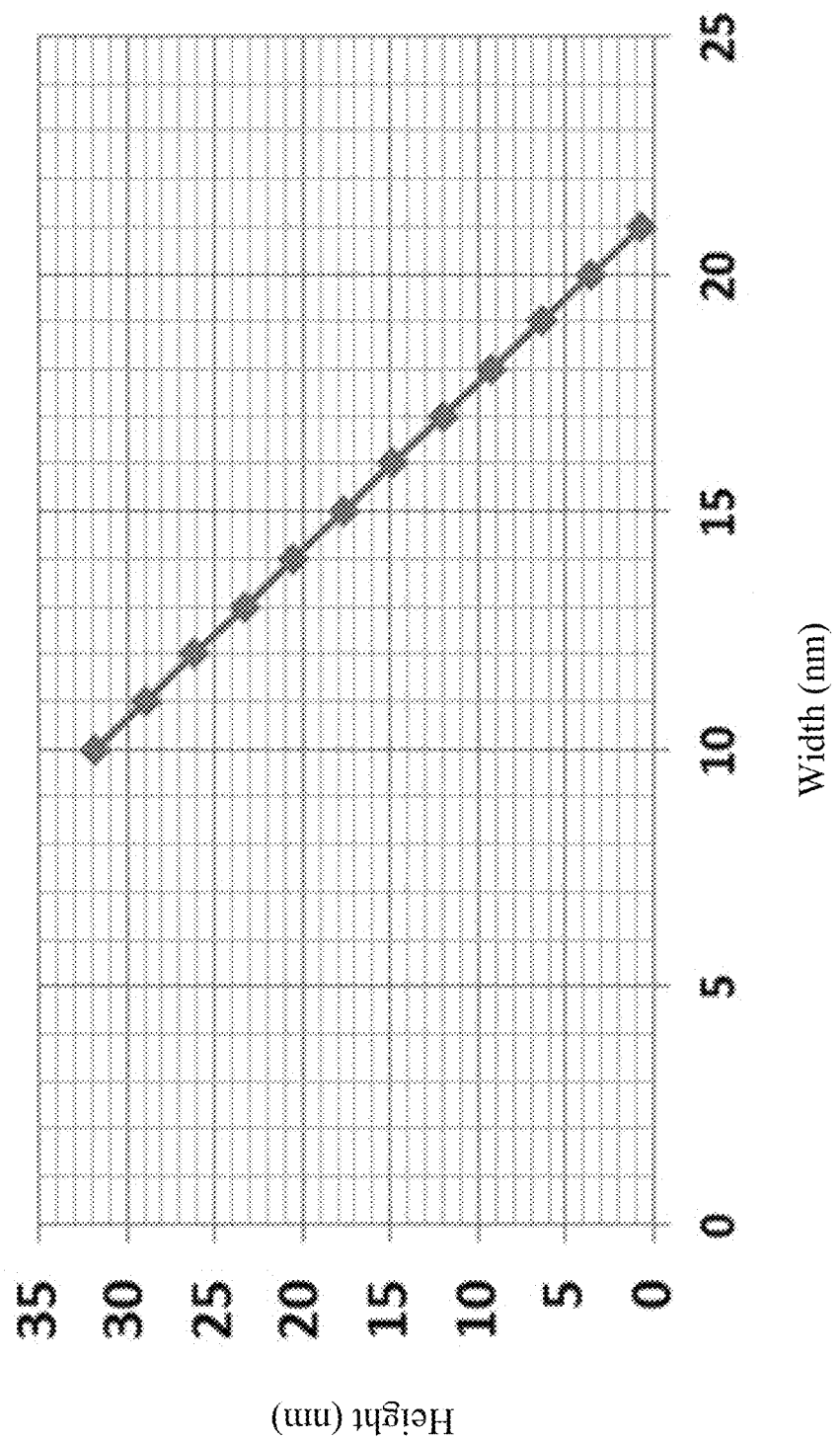
FIG. 7 is a graph representing the relationships of widths of an epitaxy structure vs. heights of a dielectric fin sidewall structure.

FIG. 7 is a graph representing the relationships of (lateral) widths of an epitaxy structure vs. heights of a dielectric fin sidewall structure. The vertical axis of the graph shows the height of the dielectric fin sidewall structure, and the horizontal axis shows the (lateral) width (e.g. the width W1, W1', or W2' of FIG. 6C) of the epitaxy structure. In FIG. 7, the width of the semiconductor fin was about 6 nm, the height of the semiconductor fin was about 50 nm, and the height of the isolation structure was about 10 nm.

According to aforementioned embodiments, since the dielectric fin sidewall structures are disposed on opposite sidewalls of the semiconductor fins, the formation of the epitaxy structures can be tuned by the dielectric fin sidewall structures. In greater detail, the epitaxy growth of the epitaxy structures extends both vertically and laterally. The dielectric fin sidewall structures can adjust the vertical and lateral epitaxy growths of the epitaxy structures, such that the epitaxy structures can be separated from each other or merged together depending on the configuration of the dielectric fin sidewall structures. In greater detail, the heights of the dielectric fin sidewall structures on opposite sidewalls of the same semiconductor fin are different, such that the epitaxy structure formed thereon can be off center. Hence, the adjacent epitaxy structures can be physically connected or separated farther.

According to some embodiments, a method for manufacturing an integrated circuit is provided. The method includes forming first and second semiconductor fins; forming first and second dielectric fin sidewall structures on opposite sidewalls of the first semiconductor fin, wherein the first dielectric fin sidewall structure is higher than the second dielectric fin sidewall structure, and the second dielectric fin sidewall structure is between the first and second semiconductor fins; recessing at least a portion of the first semiconductor fin between the first and second dielectric fin sidewall structures until a top of the recessed portion of the first semiconductor fin is lower than a top of the first dielectric fin sidewall structure; and forming a first epitaxy structure on the recessed portion of the first semiconductor fin.

According to some embodiments, a method for manufacturing an integrated circuit is provided. The method includes forming a first semiconductor fin, a second semiconductor fin and a third semiconductor fin between the first and second semiconductor fin, a distance between the third semiconductor fin and the first semiconductor fin being shorter than a distance between the third semiconductor fin and the second semiconductor fin; depositing a dielectric layer over the first, second and third semiconductor fins such that a portion of the dielectric layer between the third and second semiconductor fins is thicker than a portion of the dielectric layer between the third and first semiconductor fins; etching the dielectric layer to form a plurality of fin sidewall structures on sidewalls of the first, second and third semiconductor fins, respectively; and after forming the fin sidewall structures, forming first, second and third epitaxy structures on the first, second and third semiconductor fins, respectively.

According to some embodiments, a method for manufacturing an integrated circuit is provided. The method includes forming a semiconductor fin protruding from a substrate; forming a shallow trench isolation (STI) region around a lower portion of the semiconductor fin; forming a first and second fin sidewall spacers on opposite sidewalls of an upper portion of the semiconductor fin; recessing the semiconductor fin; and epitaxially growing a source/drain structure from the recessed semiconductor fin, wherein a first rounded portion of the source/drain structure above the first fin sidewall spacer has a bottommost position lower than a bottommost position of a second rounded portion of the source/drain structure above the second fin sidewall spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit, the method comprising:
    forming first and second semiconductor fins;
    forming first and second dielectric fin sidewall structures on opposite sidewalls of the first semiconductor fin, and forming third and fourth dielectric fin sidewall structures on opposite sidewalls of the second semiconductor fin, wherein the first dielectric fin sidewall structure is higher than the second dielectric fin sidewall structure, and the second dielectric fin sidewall structure is between the first and second semiconductor fins, wherein the third dielectric fin sidewall structure is higher than the fourth dielectric fin sidewall structure, and the fourth dielectric fin sidewall structure is between the first and second semiconductor fins;
    recessing at least a portion of the first semiconductor fin between the first and second dielectric fin sidewall structures until a top of the recessed portion of the first semiconductor fin is lower than a top of the first dielectric fin sidewall structure;
    forming a first epitaxy structure on the recessed portion of the first semiconductor fin; and
    forming a second epitaxy structure on the second semiconductor fin, wherein forming the second epitaxy structure is performed such that the second epitaxy structure comprises a first portion extending above the third dielectric fin sidewall structure and a second portion extending above the fourth dielectric fin sidewall structure, and a width of the second portion of the second epitaxy structure is greater than a width of the first portion of the second epitaxy structure.

2. The method of claim 1, wherein forming the first epitaxy structure is performed such that the first epitaxy structure comprises a first portion extending above the first dielectric fin sidewall structure and a second portion extending above the second dielectric fin sidewall structure, and a width of the second portion of the first epitaxy structure is greater than a width of the first portion of the first epitaxy structure.

3. The method of claim 1, wherein the first and second epitaxy structures are merged.

4. The method of claim 3, wherein forming the first epitaxy structure and forming the second epitaxy structure are performed such that the merged first and second epitaxy structures in combination have two peaks and a valley between the peaks.

5. The method of claim 4, wherein the peaks of the merged first and second epitaxy structures are off-center from the first and second semiconductor fins.

6. The method of claim 4, wherein the peaks of the merged first and second epitaxy structures are spaced apart by a distance shorter than a center-to-center distance between the first and second semiconductor fins.

7. The method of claim 1, wherein forming the first and second dielectric fin sidewall structures comprises:
   depositing a dielectric layer using a plasma-enhanced chemical vapor deposition process with ion bombardment; and
   etching the dielectric layer to form the first and second dielectric fin sidewall structures.

8. The method of claim 1, wherein recessing the portion of the first semiconductor fin between the first and second dielectric fin sidewall structures is performed such that the top of the recessed portion of the first semiconductor fin is lower than a top of the second dielectric fin sidewall structure.

9. A method for manufacturing an integrated circuit, the method comprising:
   forming a first semiconductor fin, a second semiconductor fin and a third semiconductor fin between the first and second semiconductor fins, a distance between the third semiconductor fin and the first semiconductor fin being shorter than a distance between the third semiconductor fin and the second semiconductor fin;
   depositing a dielectric layer over the first, second and third semiconductor fins such that a portion of the dielectric layer between the third and second semiconductor fins is thicker than a portion of the dielectric layer between the third and first semiconductor fins;
   etching the dielectric layer to form a plurality of fin sidewall structures on sidewalls of the first, second and third semiconductor fins, respectively; and
   after forming the fin sidewall structures, forming first, second and third epitaxy structures on the first, second and third semiconductor fins, respectively.

10. The method of claim 9, wherein the dielectric layer is deposited using a plasma-enhanced deposition process with ion bombardment.

11. The method of claim 9, wherein forming the first, second and third epitaxy structures is performed such that the third and first epitaxy structures are merged, and the second epitaxy structure is spaced from the merged third and first epitaxy structures.

12. The method of claim 9, wherein forming the first, second and third epitaxy structures is performed such that the third and first epitaxy structures are of a first conductive type, and the second epitaxy structure is of a second conductive type different than the first conductive type.

13. The method of claim 9, further comprising:
   recessing the first, second and third semiconductor fins to a level lower than top ends of the fin sidewall structures prior to forming the first, second and third epitaxy structures.

14. A method for manufacturing an integrated circuit, the method comprising:
   forming a first semiconductor fin and a second semiconductor fin protruding from a substrate;
   forming a shallow trench isolation (STI) region around lower portions of the first and second semiconductor fins;
   forming first and second fin sidewall spacers on opposite sidewalls of an upper portion of the first semiconductor fin, and third and fourth fin sidewall spacers on opposite sidewalls of an upper portion of the second semiconductor fin, wherein the second and fourth fin sidewall spacers are between the first and second semiconductor fins, and the first and third fin sidewall spacers are higher than the second and fourth fin sidewall spacers;
   recessing the first and second semiconductor fins;
   epitaxially growing a first source/drain structure from the recessed first semiconductor fin, wherein a first rounded portion of the first source/drain structure above the first fin sidewall spacer has a bottommost position higher than a bottommost position of a second rounded portion of the first source/drain structure above the second fin sidewall spacer; and
   epitaxially growing a second source/drain structure on the second semiconductor fin, the second source/drain structure comprises a first portion extending above the third fin sidewall spacer and a second portion extending above the fourth fin sidewall spacer, and a width of the second portion of the second epitaxy structure is greater than a width of the first portion of the second epitaxy structure.

15. The method of claim 14, wherein epitaxially growing the first source/drain structure is performed such that the first source/drain structure has an asymmetric cross-sectional profile.

16. The method of claim 14, wherein epitaxially growing the first source/drain structure is performed such that the first rounded portion of the first source/drain structure laterally extends a width less than that of the second rounded portion of the first source/drain structure.

17. The method of claim 14, wherein epitaxially growing the first source/drain structure is performed such that the first source/drain structure is off-center from the first semiconductor fin.

18. The method of claim 14, wherein forming the first, second, third, and fourth fin sidewall spacers comprises:
   depositing a dielectric layer over the first and second semiconductor fins such that a first portion of the dielectric layer between the first and second semiconductor fins is thicker than a second portion of the dielectric layer not between the first and second semiconductor fins; and
   etching the dielectric layer to form the first, second, third, and fourth fin sidewall spacers.

19. The method of claim 18, wherein the dielectric layer is deposited with ion bombardment.

20. The method of claim 14, further comprising:
   forming a gate structure over the first and second semiconductor fins; and prior to forming the first, second, third, and fourth fin sidewall spacers, forming gate spacers on opposite sidewalls of the gate structure.

\* \* \* \* \*